(12) United States Patent
Cole et al.

(10) Patent No.: US 6,825,486 B1
(45) Date of Patent: Nov. 30, 2004

(54) SYSTEM FOR MAPPING WAFERS USING PREDICTIVE DYNAMIC LIGHTING

(75) Inventors: Samuel J. Cole, Portland, OR (US); Ric DeHoff, Hillsboro, OR (US); Edward D. Seeberger, Jr., Portland, OR (US)

(73) Assignee: CyberOptics Corporation, Golden Valley, MN (US)

( * ) Notice: Subject to any disclaimer, the term of this patent is extended or adjusted under 35 U.S.C. 154(b) by 295 days.

(21) Appl. No.: 10/190,898

(22) Filed: Jul. 8, 2002

Related U.S. Application Data

(60) Provisional application No. 60/305,233, filed on Jul. 13, 2001.

(51) Int. Cl.[7] .................................................. G06K 9/00
(52) U.S. Cl. ............... 250/559.4; 250/205; 250/559.36; 414/936
(58) Field of Search .......................... 250/205, 559.33, 250/559.36, 559.4; 414/936–938, 940, 941; 356/614; 438/16

(56) References Cited

U.S. PATENT DOCUMENTS

| 5,504,345 A | | 4/1996 | Bartunek et al. ......... 250/559.4 |
| 6,188,323 B1 | * | 2/2001 | Rosenquist et al. ...... 340/686.5 |
| 6,636,626 B1 | * | 10/2003 | Yoo et al. .................... 382/151 |
| 2003/0141465 A1 | * | 7/2003 | Schuda .................. 250/559.29 |

OTHER PUBLICATIONS

U.S. patent application Ser. No. 10/190,744, Cole et al., filed Jul. 8, 2002.

* cited by examiner

Primary Examiner—Stephone B. Allen
(74) Attorney, Agent, or Firm—Westman, Champlin & Kelly, P.A.

(57) ABSTRACT

A wafer mapping system includes an imaging array, at least one lighting module and a controller coupled to the imaging array and the lighting module. The controller is adapted to receive information relative to an initial acquired wafer image and adjust illumination from the lighting module based upon the initial acquired wafer image, and acquire a subsequent wafer image using the adjusted illumination.

16 Claims, 3 Drawing Sheets

SYSTEM FOR MAPPING WAFERS USING PREDICTIVE DYNAMIC LIGHTING

CROSS REFERENCE TO CO-PENDING APPLICATION

This application claims priority benefits from U.S. Provisional patent application Ser. No. 60/305,233, filed Jul. 13, 2001 and entitled "System for Mapping Wafers Using Predictive Dynamic Lighting."

COPYRIGHT RESERVATION

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

This invention relates to wafer mapping systems.

BACKGROUND OF THE INVENTION

Wafer mapping is an important element in semiconductor manufacturing. Each wafer may include many semiconductor chips and represent thousands of dollars worth of materials and time. Wafer mapping is a process wherein errors can be detected and addressed before significant manufacturing losses occur. As used herein, "mapping wafers" means scanning a set of wafers in either a transport or storage cassette or pod, and determining which slots in the cassette or pod have wafers in them and whether any of the wafers are incorrectly placed. Preferably, a device in accordance with embodiments of the present invention is mounted on a wafer-handling robot (a known robotic system used in wafer manufacture), and maps the wafers as the robot arm moves in a generally vertical path in front of the cassette or pod.

Wafer mapping systems use high-quality images to calculate location, thickness and correct slotting of one or more wafers. The amount of incident light that a wafer reflects can vary significantly. At one extreme, unprocessed wafers reflect a large portion of incident light. As processing steps add thin layers to the wafer's surface, the wafer may only reflect a small fraction of the incident light. There are currently no fixed lighting schemes that can produce high-quality images for both kinds of wafers. As a result, known wafer processing systems cannot easily and accurately map both unprocessed and in-process wafers reliably.

SUMMARY OF THE INVENTION

A wafer mapping system includes an imaging array, at least one lighting module and a controller coupled to the imaging array and the lighting module. The controller is adapted to receive information relative to an initial acquired wafer image and adjust illumination from the lighting module based upon the initial acquired wafer image, and acquire a subsequent wafer image using the adjusted illumination.

DETAILED DESCRIPTION

Figure 1:
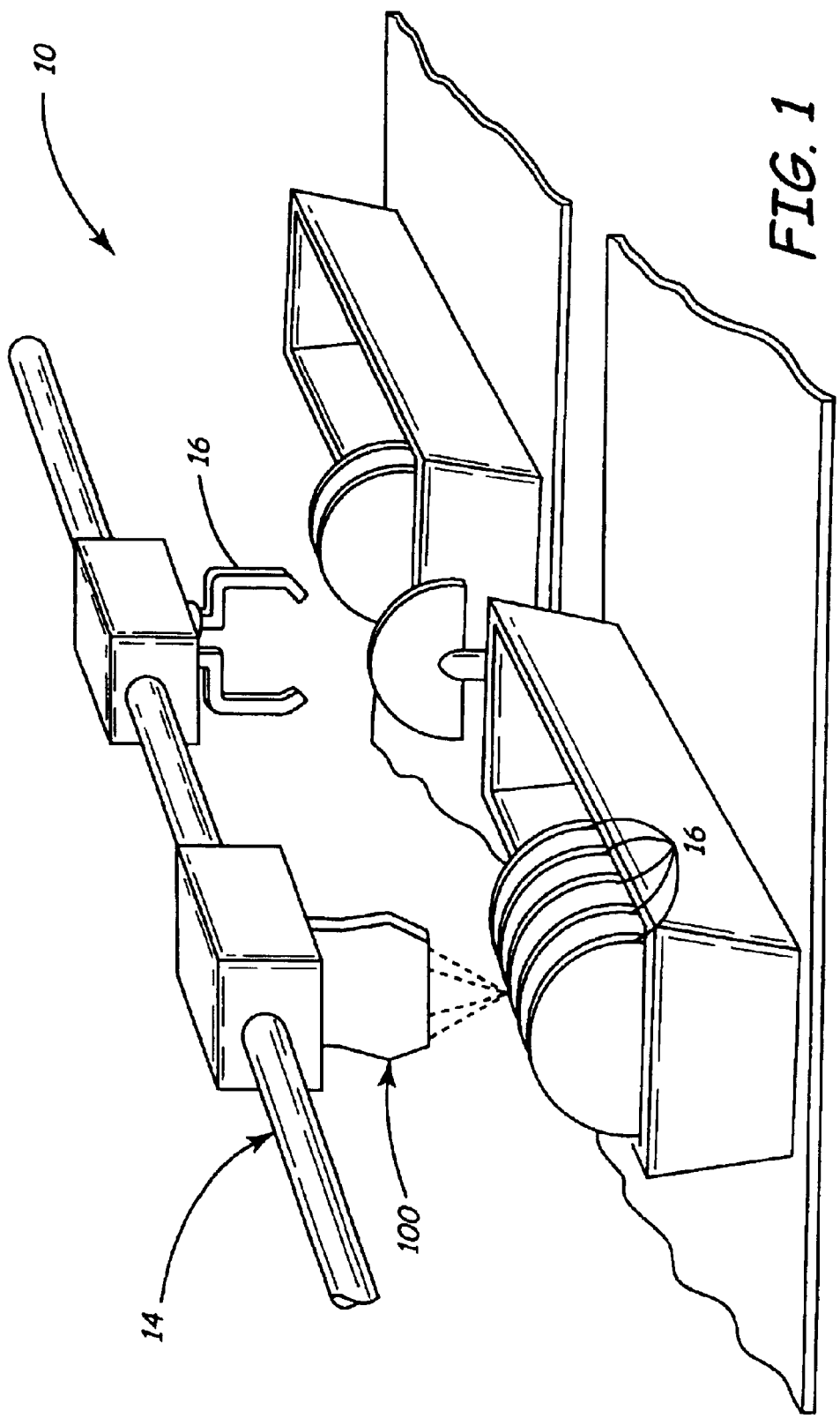
FIG. 1 is a diagrammatic view of a processing system in which embodiments of the present invention are particularly useful.

FIG. 1 is a diagrammatic view of a processing system in which embodiments of the present invention are particularly useful. Wafer processing system 10 includes a wafer mapping system 100 coupled to robotic system 14, such that system 100 is movable relative to wafers 16. As system 100 moves past wafers 16, it provides an external signal indicative of wafer presence and/or wafer positioning errors. This signal is used by system 10 to direct the action of gripper 16 during wafer processing.

Figure 2:
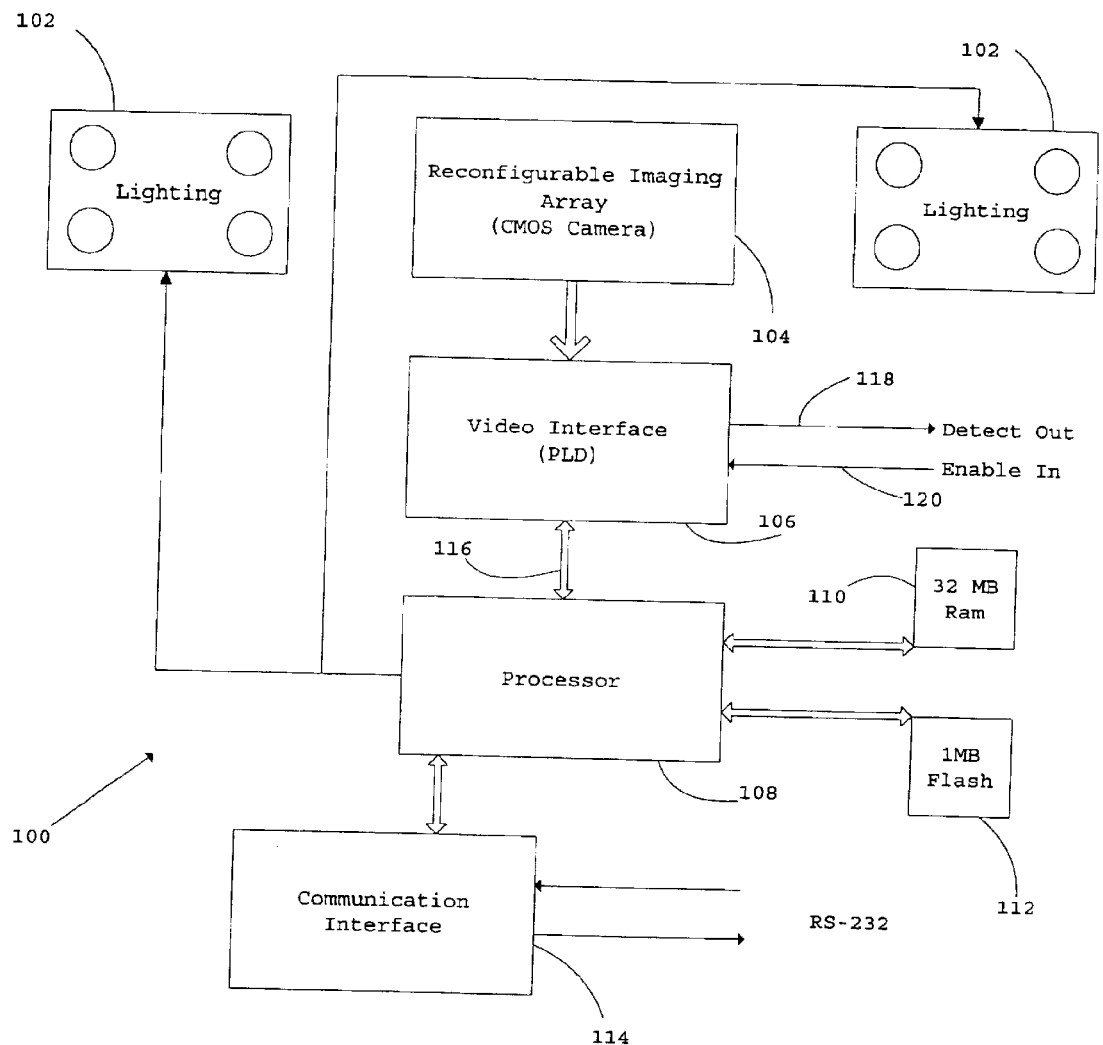
FIG. 2 is a diagrammatic view of a wafer mapping system in accordance with embodiments of the present invention.

FIG. 2 is a diagrammatic view of wafer mapping system 100 in accordance with embodiments of the present invention. System 100 includes lighting modules 102, imaging array 104, video interface 106, processor 108, memory modules 110, 112 and communication interface 114.

Lighting modules 102 are disposed to illuminate wafers 16 in accordance with the improved wafer illumination techniques set forth below. The illumination generated by module(s) 102 reflects off a given wafer 16 and the illuminated wafer image is captured by imaging array 104.

Array 104 is preferably a two-dimensional area array, such as a CMOS sensor, although various types of CCD detectors may be used. By using a CMOS sensor, high-speed video capture can be achieved allowing multiple images of a single wafer 16 to be acquired as array 104 moves the wafer. Array 104 provides signals to video interface 106 (which is preferably a Programmable Logic Device), which, in turn provides data indicative of a captured image to processor 108 along bus 116. Interface 106 includes Detect Out line 118 and Enable In line 120 in order to facilitate image acquisition. Processor 108 is preferably coupled to memory modules 110 and 112. Module 110 is preferably 32 Megabytes of random access memory which is suitable for storing images, and temporary program data as well as other transitive information. Processor 108 is also preferably coupled to module 112 which is a one megabyte flash memory module. Flash memory is useful for storing relatively fixed data such as operating instructions for system 100 and such.

Processor 108 provides data to communication interface 114 for output. In the embodiment shown, communication interface provides the output data over an RS-232 serial link, however other communication methods and protocols are contemplated.

Processor 108 is coupled to lighting module(s) 102, and thus can dynamically control illumination of wafers through module(s) 102. Thus, system 100 provides a lighting and imaging system that captures several images of each wafer as the robot arm moves past the wafer. Processor 108 is adapted to process the images in real-time to determine the location and correctness of placement of each wafer.

Controlling the intensity of illumination incident upon the wafer makes it possible for the system 100 to determine wafer location, thickness and orientation across a range of wafer reflectivity. Clean, shiny wafers require very little light to produce a good image, whereas wafers that scatter a lot of incident light require a high level of illumination to produce acceptable images. As described above, system 100 uses two-dimensional imaging array 104 to capture images of the stack of wafers in a cassette as the robot moves along a path in front of the stack of wafers in the cassette or pod. Different robots perform this scan at different speeds and even different directions. Array 104 operates fast enough for several images of each wafer 16 to be obtained in a scan. Dynamic lighting in system 100 is preferably achieved by two components, a hardware component and a software component. The hardware component modifies the amount of light that reaches the target either by varying the current through one or both of light modules 102 or by limiting the fraction of time that one or both of light modules 102 is on during camera exposure by modulating the power supply to light modules 102. Light-emitting diodes (LEDs) are preferably used as light modules 102. The fraction of time that the LEDs are on is controllable in relatively small increments (preferably ½ percent amounts) over the length of the shortest array exposure time.

The software component uses the initially captured one or two images of a wafer to adjust the lighting. The lighting level for the subsequent exposure is determined by reviewing the first one or two images for contrast and dynamically changing illumination for the next image based upon the review. In one embodiment, the system quantifies image brightness by counting the number of highly saturated pixels in each image region. One example of such quantification includes breaking the image into 100 equal rectangular regions, and then counting the number of pixels in each region that exceeds a high, nearly saturated value. The sum of the number of saturated pixels in two vertically adjacent regions can be used to determine the lighting level. If there are several two-region areas with the same saturated pixel count, the pair that is nearest the center of the image is used. This saturated pixel count is used to predict a better lighting setting for the next image. If the count is high, then the lights should be turned down quite low. If the count is only marginally too high, then a medium lighting level is appropriate. If the saturated pixel count is below either of these levels, no change should be made in the lighting level.

Other methods where real-time reflected light intensity from one image help determine the intensity of a later lighting intensity can also be used. For example, similar image processing to that described above with respect to saturated pixels can be performed for dark or black pixels. Thus, the dark pixel count can also be used to help determine illumination intensity for the subsequent image.

Figure 3:
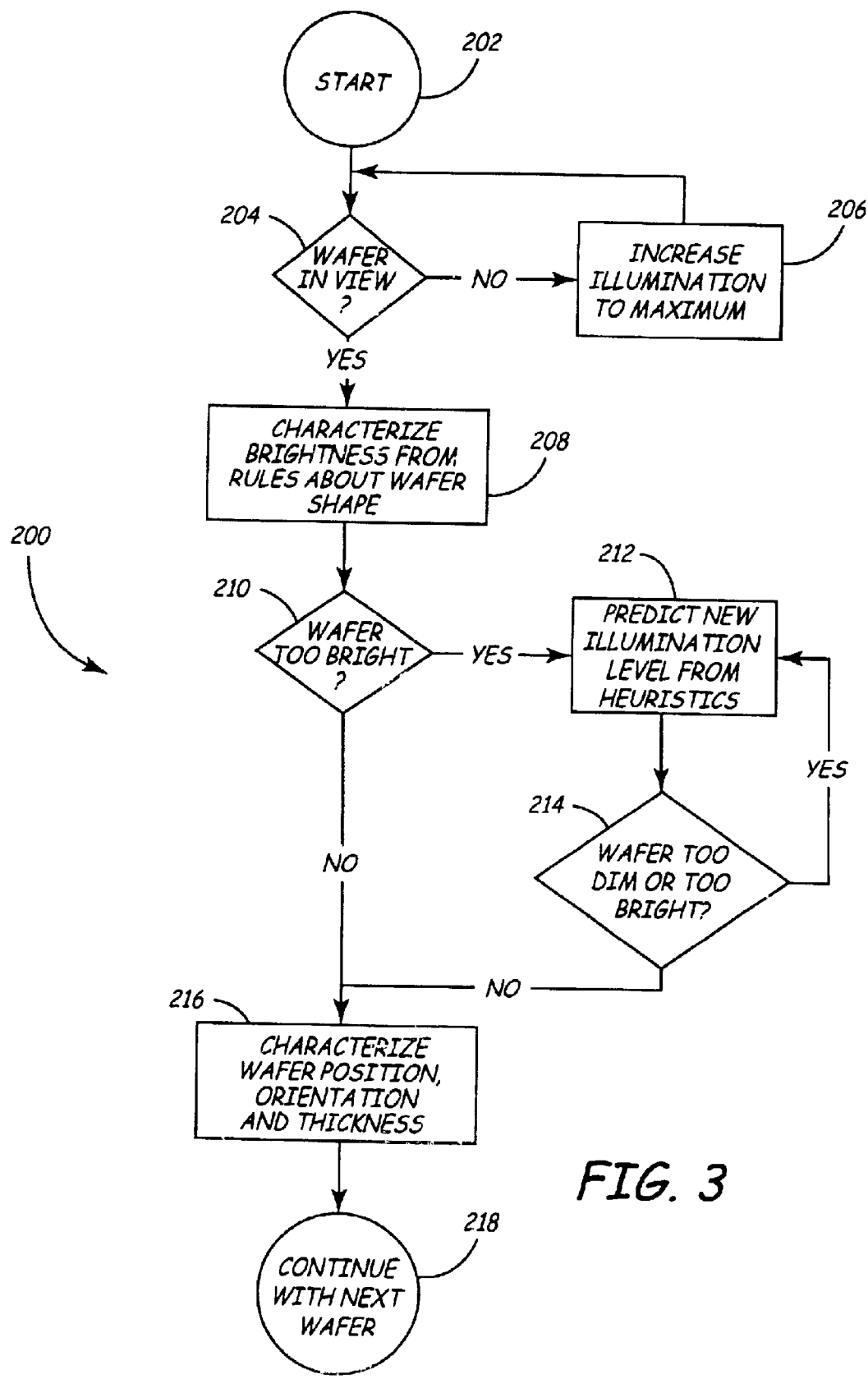
FIG. 3 is a flow diagram of a method in accordance with an embodiment of the present invention.

FIG. 3 is a flow diagram of a method in accordance with an embodiment of the present invention. Method 200 begins at step 202 where an initial image or two are acquired at an initial illumination intensity. At step 204, system 100 determines if the acquired image(s) indicate whether a wafer is in view. If a wafer is not in view, control passes to step 206 where illumination intensity is increased to an illumination maximum. Step 206 passes control back to step 204 to determine if a wafer is in view with the maximum illumination. If a wafer is not in view at the maximum intensity, control passes to step 218 where the method continues with the next wafer after suitable motion of the robot, and after resetting the illumination intensity to the initial value.

Once system 100 successfully determines that a wafer is in view at step 204, control passes to step 208 where the brightness is characterized based upon information about the wafer shape. Brightness is characterized by counting the number of saturated pixels in rectangular segments of the image. Saturated pixels have values that are near the upper limit. The size of the rectangular segments corresponds approximately to the vertical and horizontal extent of the image of a correctly illuminated wafer.

Once step 208 has been completed, control passes to step 210 where system 100 determines if the wafer image is too bright. If the wafer image is too bright, control passes to step 212 where a new illumination level is predicted based upon empirically determined heuristics.

For example, if a count of saturated pixels in one or more selected regions exceeds a "HIGH" threshold, then the illumination intensity is reduced to a "LOW" value. Further, if the count exceeds a "MEDIUM" threshold, then the illumination intensity is set to a medium level. Once step 212 finishes, control passes to step 214 where system 100 determines if the wafer image acquired with the adjusted illumination is too dim or too bright. If the illumination was too dim or too bright, control returns to step 212 where illumination is adjusted again. Once system 100 determines, at step 214, that the wafer image was not too bright or too dim control passes to step 216 just as if the image had been acceptable at step 210. At step 216, system 100 characterizes wafer position, orientation and thickness and provides a suitable output based upon such characterization. After step 216, control passes to step 218, where the method is performed again on the next wafer.

The lighting methods set forth herein provide self-correcting abilities. If the saturated pixel count from an image indicated that a lower lighting level should be used, and the next image contains no image of the wafer, the system will set a higher illumination intensity level for the next image.

Both the saturated pixel count thresholds and the precise lighting level are determined by finding a combination that produces highly reliable results over a wide variation of wafers and ambient lighting conditions.

Although the present invention has been described with reference to preferred embodiments, workers skilled in the art will recognize that changes may be made in form and detail without departing from the spirit and scope of the invention. For example, embodiments of the present invention are applicable to any sort of illumination, including, but not limited to, LEDs and laser diodes. For example, although much of the disclosure is directed to image processing by counting regions of saturated pixels, it is expressly contemplated that regions of dark or black pixels can also be counted. Further, the methods of counting saturated pixels and counting dark pixels are not mutually exclusive, and can be performed in combination.

What is claimed is:

1. A wafer mapping system comprising:
   an imaging array;
   at least one lighting module;
   a processor coupled to the imaging array and the at least one lighting module;
   wherein the processor is adapted to receive information relative to an initial acquired wafer image and direct the at least one lighting module to adjust illumination intensity based upon the initial acquired wafer image; and
   wherein the imaging array acquires a subsequent wafer image using the adjusted illumination.

2. The system of claim 1, wherein the imaging array is a two-dimensional array.

3. The system of claim 2, wherein the array is a Charge Coupled Device (CCD).

4. The system of claim 2, wherein the array is a Complementary Metal Oxide Semiconductor (CMOS) device.

5. The system of claim 1, wherein the at least one lighting module includes a light emitting diode.

6. The system of claim 1, wherein the at least one lighting module includes a laser diode.

7. The system of claim 1, wherein the at least one lighting modules includes at pair of lighting modules each coupled to the processor.

8. The system of claim 1, wherein the processor is a digital signal processor.

9. The system of claim 1, wherein the processor is adapted to quantify brightness of the initial image, and calculate the adjusted illumination based upon the quantification.

10. The system of claim 9, wherein the processor is adapted to break the initial image into smaller regions and counts a number of saturated pixels in each region.

11. The system of claim 10, wherein the processor is adapted to calculate the adjusted illumination based upon a sum of saturated pixels in two adjacent regions.

12. A method of mapping wafers, the method comprising the steps of:
   acquiring an initial image at an initial illumination intensity;
   processing the initial image to quantify image brightness; and
   adjusting illumination intensity based upon the a characteristic of the initial image;
   acquiring a subsequent image using the adjusted illumination intensity; and
   using at least the subsequent image to provide data for wafer mapping.

13. The method of claim 12, wherein processing the initial image includes counting a number of saturated pixels in the image.

14. A method of mapping wafers, the method comprising:
   a) illuminating a wafer slot position with an initial illumination intensity;
   b) determining if a wafer is in view of an imaging array;
   c) illuminating the wafer slot position with a maximum illumination intensity if a wafer was not in view at step b;
   d) acquiring a subsequent image of the wafer slot position at the maximum intensity; and
   e) determining if the subsequent image is not too bright and providing mapping data if the subsequent image is not too bright.

15. The method of claim 14, wherein a new illumination intensity is set if the subsequent image is determined to be too bright at step e, and wherein a second sequent image is acquired using the new illumination intensity.

16. The method of claim 15, wherein the second subsequent image is used to provide mapping data.

* * * * *